US006677830B2

(12) United States Patent
Miller, Jr. et al.

(10) Patent No.: US 6,677,830 B2
(45) Date of Patent: Jan. 13, 2004

(54) BROADBAND MATCHING NETWORK FOR AN ELECTROABSORPTION OPTICAL MODULATOR

(75) Inventors: Thomas James Miller, Jr., Fleetwood Township, PA (US); Prashant Kumar Singh, Upper Macungie, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 111 days.

(21) Appl. No.: 09/950,495

(22) Filed: Sep. 11, 2001

(65) Prior Publication Data

US 2003/0048147 A1 Mar. 13, 2003

(51) Int. Cl.[7] .......... H03H 7/38

(52) U.S. Cl. .......... 333/33; 333/34; 333/35; 333/248; 333/263

(58) Field of Search .......... 333/33, 34, 35, 333/248, 263

(56) References Cited

U.S. PATENT DOCUMENTS

| | | | | | |
|---|---|---|---|---|---|
| 3,662,294 | A | * | 5/1972 | Jacobs et al. | 333/33 |
| 3,680,002 | A | * | 7/1972 | Quine | 331/96 |
| 3,875,538 | A | * | 4/1975 | Minet et al. | 333/204 |
| 4,320,353 | A | * | 3/1982 | Sasaki | 330/286 |
| 4,330,868 | A | * | 5/1982 | Hallford | 333/26 |
| 4,350,958 | A | * | 9/1982 | Pagnamenta | 330/286 |
| 4,491,809 | A | * | 1/1985 | Noda et al. | 330/277 |
| 5,221,988 | A | * | 6/1993 | Juhasz | 359/245 |
| 6,101,295 | A | * | 8/2000 | Mineo et al. | 333/33 |

* cited by examiner

*Primary Examiner*—Michael Tokar
*Assistant Examiner*—Khai Nguyen
(74) *Attorney, Agent, or Firm*—Wendy W. Koba

(57) ABSTRACT

A broadband impedance matching circuit for use with an optical device such as an electroabsorption optical modulator comprises a microstrip transmission line, including pairs of like-sized open stubs disposed on opposite sides of the transmission line along its length. The number of open stubs, as well as their dimensions and location are chosen to provide for broadband impedance matching (from dc to several GHz) between an external electrical signal source and the optical device.

13 Claims, 3 Drawing Sheets

12

BROADBAND MATCHING NETWORK FOR AN ELECTROABSORPTION OPTICAL MODULATOR

TECHNICAL FIELD

The present invention relates to the field of electroabsorption optical modulators and, more particularly, to the utilization of a microstrip circuit to provide broadband impedance matching between the modulator and an external driving signal source.

BACKGROUND OF THE INVENTION

In a conventional arrangement of an electroabsorption optical modulator, the modulator is positioned on an optical substrate, with an input (cw) optical signal applied along the input facet of the optical device and an output, modulated signal exiting from the output facet of the optical device, the input and output facets being defined as a pair of parallel endfaces. An electrical modulating signal is coupled to a surface area of the electroabsorption optical modulator, where the presence of this electrical signal will alter the characteristics of the input optical signal so as to produce a desired modulated waveform in the output optical signal.

In most cases, a microstrip transmission line element is used to couple the electrical signal between an external signal source and the electroabsorption optical modulator, due to the high frequency of the modulation signal. In order to allow for optimum signal transfer from the external signal source to the optical modulator, it is beneficial to provide impedance matching between these elements to improve the return loss of the modulator (improved efficiency in the system). Previous attempts at providing such matching have heretofore concentrated on a narrowband approach and, therefore, have been successful in lowering the return loss at a single frequency (or an extremely narrow range of frequencies). U.S. Pat. No. 6,101,295, issued to Naoyuki Mineo et al. on Aug. 8, 2000, discloses one such narrowband approach. In this case, a microstrip transmission line is formed to include a pair of open stubs along one side of the transmission line. By carefully choosing and controlling the dimensions of the pair of open stubs (in terms of both length and width), Mineo et al. is able to improve the return loss to be maintained in the range of −9 dB to −30 db over a narrow frequency range of 57.6–61.6 GHz.

However, as the frequency of operation extends beyond these bounds in either direction, the return loss associated with the Mineo et al. arrangement soon becomes unacceptable. In addition, this narrowband technique is based on small signal analysis, which assumes that the operating point of the modulator is independent of the applied signal.

Most telecommunications applications have now developed to the point of requiring broadband operation, as a result of increasing the number of data channels supported along a transmission line. Under these conditions, a narrowband matching scheme, such as proposed by Mineo et al., will not provide significant improvement in the return loss of an electroabsorption optical modulator. Thus, a need remains in the prior art for a broadband impedance matching circuit acceptable for use in telecommunications applications of an electroabsorption optical modulator.

SUMMARY OF THE INVENTION

The need remaining in the prior art is addressed by the present invention, which relates to the utilization of a symmetric microstrip transmission line to provide broadband impedance matching between an electroabsorption optical modulator and an external driving signal source.

In accordance with the present invention, a broadband circuit for providing impedance matching between a broadband electrical signal source and an optical device (such as an electroabsorption optical modulator) comprises a microstrip transmission line coupled at a first end to the optical device and coupled at a second, opposite end to the broadband signal source, the transmission line defined as comprising a predetermined length L and width W for supporting propagation of an electrical input signal from the broadband signal source, and at least three pair of open stubs, joined to the microstrip transmission line, with each stub in a pair of stubs having a substantially identical length l and width w and disposed on opposite sides of said transmission line in a symmetrical arrangement.

The utilization of multiple open stubs, in a symmetric arrangement, provides for a "flattening" of the return loss response characteristic of the electroabsorption modulator over a broad frequency range, resulting in a broadband impedance matching arrangement.

An aspect of the present invention, as discussed in detail below, is that the application of an actual broadband data signal, through the inventive impedance matching arrangement and onto the modulator, will have the effect of reducing the capacitance of the device and therefore improve its performance.

Other and further aspects of the present invention will become apparent during the course of the following discussion and by reference to the accompanying drawings.

BRIEF DESCRIPTION OF THE DRAWINGS

Referring now to the drawings, where like reference numerals refer to like parts in several views.

DETAILED DESCRIPTION

Figure 1:
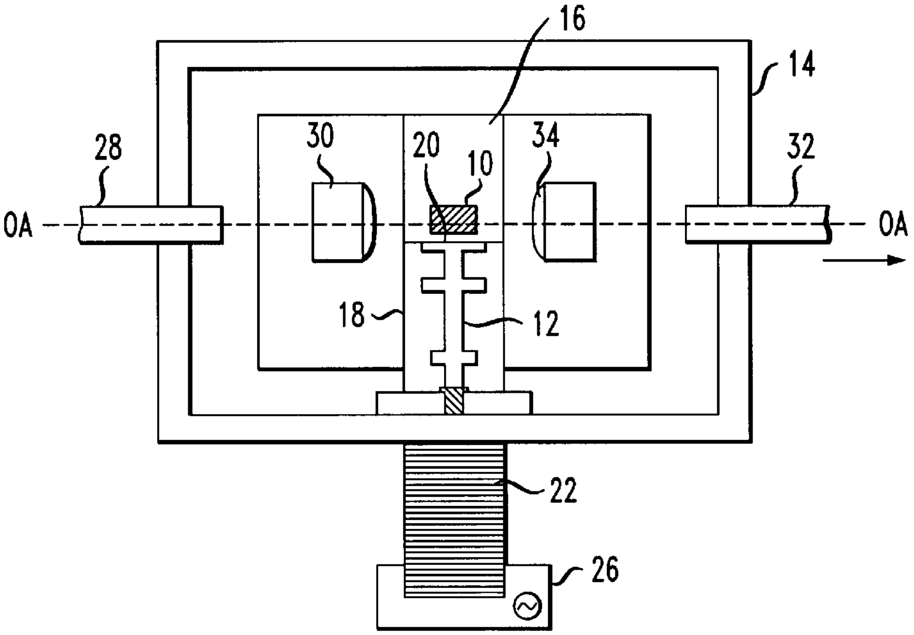
FIG. 1 is a simplified top view of an exemplary "packaged" modulator, showing the application of both the electrical input signal and the optical input signal, utilizing the broadband impedance matching microstrip transmission line of the present invention.

FIG. 1 contains a top view of an exemplary packaged electroabsorption optical modulator 10 employing a broadband impedance matching microstrip transmission line 12 formed in accordance with the present invention. As shown, both optical modulator 10 and microstrip transmission line 12 are disposed in an optical package 14, with modulator 10 disposed on a first substrate mount 16 and broadband microstrip 12 disposed on a second substrate mount 18. A wirebond 20 is used to provide the electrical connection between modulator 10 and microstrip transmission line 12, while an RF connector 22 is disposed through a sidewall 24 of package 14 and is used to form the broadband connection between microstrip transmission line 12 and an external source 26 of the electrical modulation signal that will propagate through microstrip 12 and be applied as the electrical input to modulator 10. Also shown in FIG. 1, for the sake of completeness, is a first optical waveguide 28 (e.g., fiber) disposed through a wall of package 14 that is aligned with the optical axis (OA) of modulator 10 and used to provide the optical input signal to modulator 10. A focusing lens 30 may be included within package 14 and positioned between first waveguide 28 and modulator 10. A second, output optical waveguide 32 is disposed, as shown, along the output optical axis of modulator 10 and will thus provide the output signal path for the modulated optical signal exiting modulator 10 (where the modulation is controlled by the electrical input signal from external source 26). A second lens 34 may be inserted in the signal path between the output of modulator 10 and second waveguide 32 and used to focus the collimated output from modulator 10 into the signal propagating region of second waveguide 32 (e.g., into the core region of an optical fiber). It is to be understood that this arrangement is exemplary only, and the utilization of a broadband impedance matching element, formed in accordance with the present invention, can be used to provide impedance matching between any optical device and an external electrical signal source.

Figure 2:
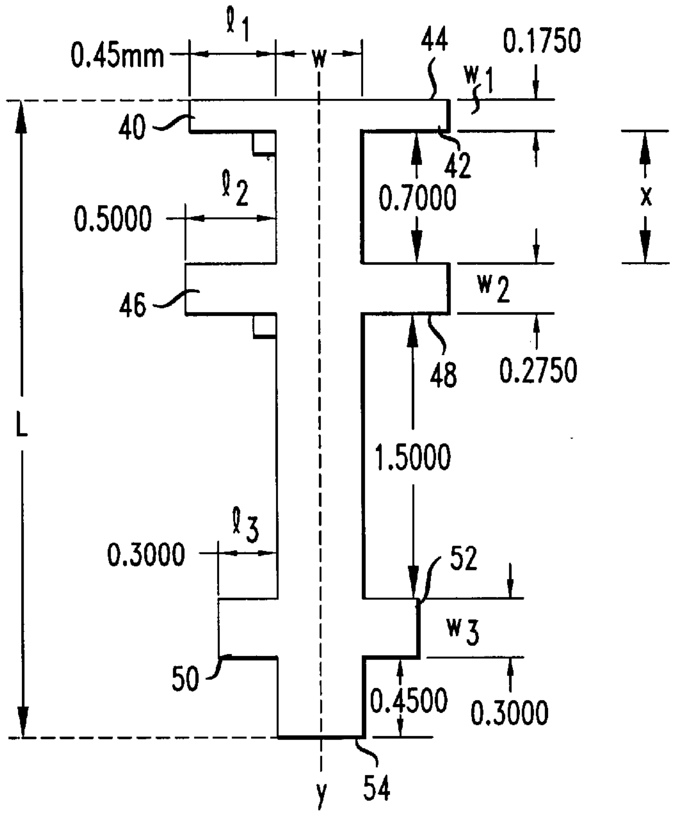
FIG. 2 is a simplified top view of a portion of the arrangement of FIG. 1, illustrating in particular an electroabsorption modulator utilizing the broadband impedance matching microstrip transmission line of the present invention.

In accordance with the present invention, improved performance of the modulator over a wide frequency range is provided by using the particular microstrip 12 shown in FIG. 1 and illustrated in detail in FIG. 2. Referring to FIG. 2, broadband microstrip transmission line 12 is shown as comprising a symmetry about the y-axis, and includes three pairs of open stubs, designed and positioned to provide the desired broadband impedance matching characteristic. In the arrangement shown in FIG. 2, the open stubs are disposed at right angles to the direction of the transmission line. Other angular dispositions are possible and are considered to fall within the spirit and scope of the present invention. In one particular embodiment, microstrip 12 comprises a width W (along the transmission line section) of approximately 0.483 mm, and a length L of approximately 3.4 mm. A first pair of open stubs, designated 40 and 42, are disposed at a first end 44 of transmission line 12, at the location where transmission line is wirebonded to modulator 10. Stubs 40 and 42 comprise an identical length and identical width, imparting a symmetric impedance characteristic at this location along microstrip transmission line 12. A second pair of open stubs, designated 46 and 48, are positioned a predetermined distance x below first pair 40,42. As shown, second pair 46,48 are slightly wider and longer than first pair 40,42. Lastly, a third pair of open stubs, designated 50,52 are formed near the opposing edge 54 of transmission line 12, near the connection between transmission line 12 and external signal source 26. In both cases, each stub in the pair has identical dimensions in terms of width and length, resulting in providing symmetrical return loss characteristics about a center frequency.

In one exemplary embodiment of the present invention, transmission line 12 may comprise an overall length L of 3.4 mm, with a width W along the central transmission section of 0.483 mm. The first pair of open stubs 40,42 are formed to comprise a length $l_1$ of 0.45 mm and a width $w_1$ of 0.175 mm. The second pair of open stubs 46,48 comprise a slightly longer length $l_2$ of 0.5 mm, and a width $w_2$ of 0.275 mm. Lastly, the third pair of open stubs, 50,52 are formed as squares with a length $l_3$ and width $w_3$ of 0.3 mm.

In accordance with the present invention, broadband impedance matching between external signal source 26 and modulator 10 is achieved by utilizing a microstrip transmission line including sets of symmetrically disposed open stubs. One measure of the effectiveness of the open stubs in broadening the frequency range of the impedance match is the "return loss" of the system. In particular, return loss can be calculated when a control, broadband signal is applied as an input from the microstrip line side, and electric power $P_1$ is input by way of the input terminal to the underside of mount 18 (not shown). The returning electrical power $P_2$ reflected by the electric power $P_1$ which has been input to the circuit is measured and the return loss (db) is calculated according to the following equation:

$$\text{Return loss (dB)}=-10\log_{10}(P_2/P_1).$$

Figure 3:
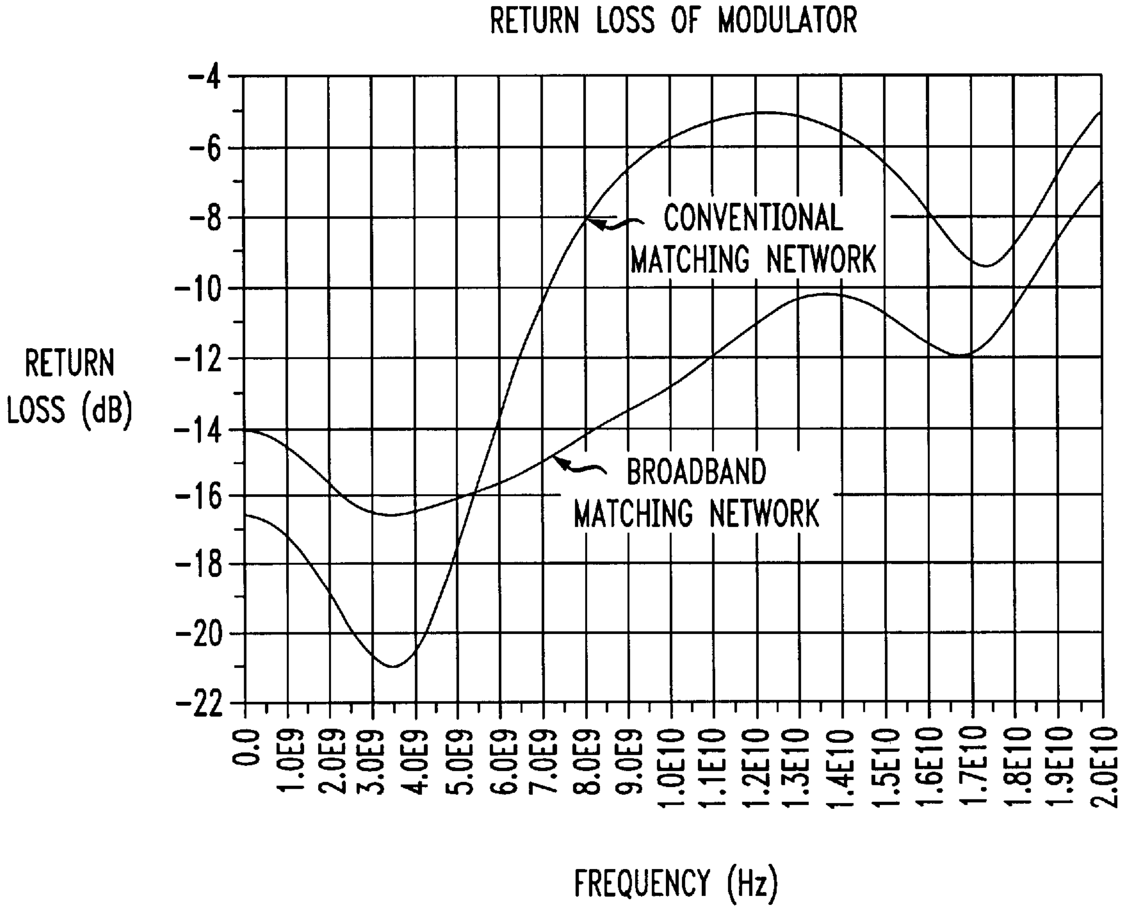
FIG. 3 is a graph comparing the improvement in performance, in terms of return loss, between a conventional (narrowband) matching network and the broadband matching network of the present invention.

FIG. 3 contains a graph illustrating the calculated performance improvement obtained by using the particular broadband microstrip transmission line of FIG. 2 in place of a conventional microstrip line. The return loss has been represented in the negative direction along the vertical axis and in the particular graph of FIG. 3, return loss is plotted as a function of frequency. A conventional matching network is shown as providing an excellent return loss (in excess of −20 dB) at a frequency of 3.5 GHz, but is well above the −10 dB level by 7 GHz. Thus, the conventional network functions well for a narrowband implementation but exhibits unacceptable loss at higher frequencies reaching a level of −5 dB at a frequency of 12 GHz. In contrast, the utilization of the particular symmetric broadband microstrip transmission line geometry of the present invention yields a "flattened" return loss response, from a value of less than −16 dB at dc to less than −10 dB to approximately 18.5 GHz.

Figure 4:
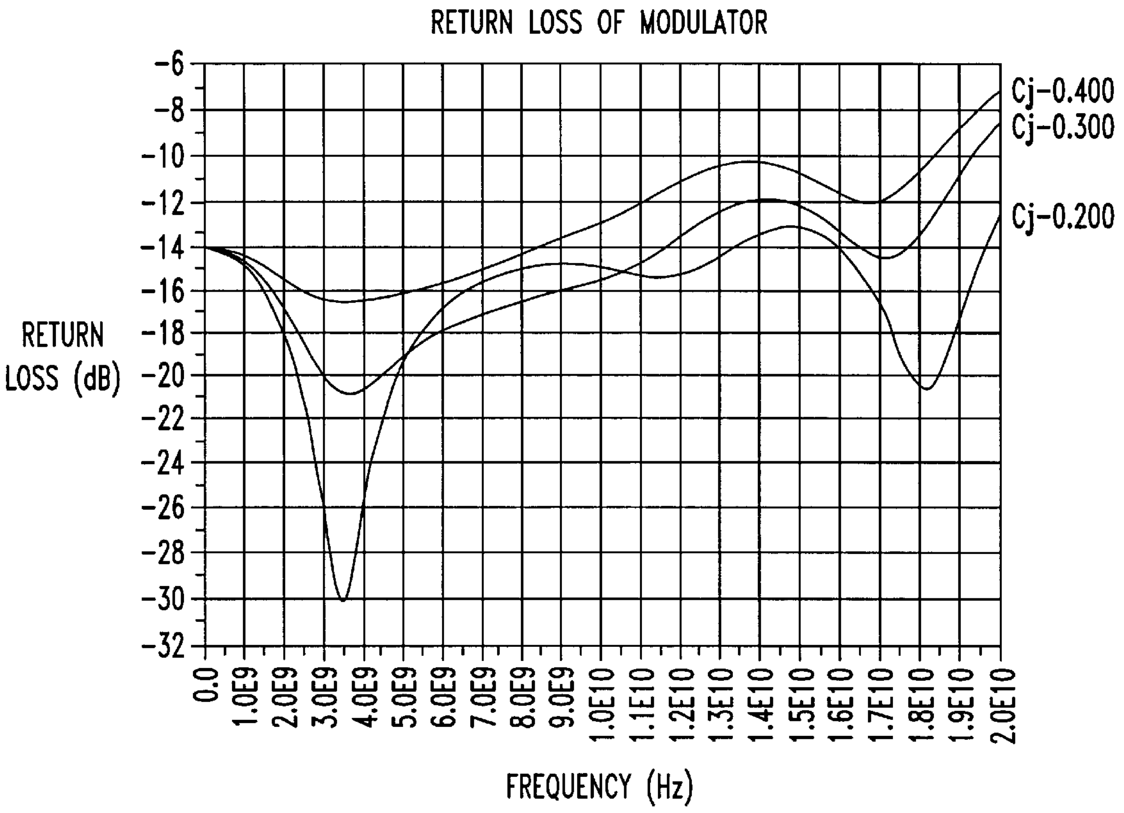
FIG. 4 is a graph of return loss associated with the broadband impedance matching microstrip transmission line of the present invention, calculated for a set of three different capacitances.

FIG. 4 illustrates the return loss associated with the broadband microstrip of the present invention as a function of the capacitance of the associated electroabsorption optical modulator is varied. A first plot is associated with a modulator capacitance of 0.20 $\mu$f and illustrates a return loss of less than −12 dB from dc to 20 GHz, remaining under a value of −14 dB for most of the frequency range. As the capacitance increases to 0.30 $\mu$f, the return loss ultimately goes above −10 db beyond a frequency of 19 GHz, remaining relatively broadband for most applications. A final graph, associated with a capacitance value of 0.40 $\mu$f, is also shown, which rises above the −10 dB level at a frequency of 18.5 GHz. Under actual modulation conditions as found, for example, telecommunications systems, the data signal applied to the modulator will have the effect of reducing the capacitance of the modulator. Therefore, the broadband microstrip network of the present invention provides good return loss under a variety of capacitive loads.

What is claimed is:

1. A broadband circuit for providing impedance matching between a broadband electrical signal source and an optical device, the circuit comprising a microstrip transmission line coupled at a first end to the optical device and coupled at a second, opposite end to the broadband electrical signal source, said transmission line defined as comprising a predetermined length L and width W for supporting propagation of an electrical signal from said broadband signal source; and at least three pair of open stubs, each pair joined to the microstrip transmission line and exhibiting unique dimensions with respect to the remaining pairs of stubs such that each pair has a different length and width, with each stub in a pair of stubs having a substantially identical length $l_i$, and width $w_i$, and disposed on opposite sides of said transmission line in a symmetrical arrangement, the subscript i denoting a particular pair of stubs in the set of at least three pair of open stubs and used to define the unique length and width of that particular pair of open stubs.

2. A broadband circuit as defined in claim 1 wherein each pair of stubs is disposed at a right angle relationship to the length L of the microstrip transmission line.

3. A broadband circuit as defined in claim 1 where the at least three pair of open stubs comprises a plurality of three pair of open stubs, a first pair disposed in proximity to the first end of the microstrip transmission line, a third pair disposed in proximity to the second, opposing end of said microstrip transmission line and a second, remaining pair disposed in a region intermediate to the first and third pair.

4. A broadband circuit as defined in claim 3 wherein the second pair of open stubs are disposed closer to the first pair of open stubs than the third pair of open stubs.

5. A broadband circuit as defined in claim 1 wherein the microstrip transmission line comprises a length L of approximately 3.4 mm and a width W of approximately 0.483 mm.

6. A broadband circuit as defined in claim 5 wherein the first pair of open stubs comprise a length $l_l$ of approximately 0.45 mm and a width $w_l$ of approximately 0.175 mm, the second pair of open stubs comprise a length $l_2$ of approximately 0.5 mm and a width $w_2$ of approximately 0.275 mm, and the third pair of open stubs comprise a length $l_3$ of approximately 0.3 mm and a width $w_3$ of approximately 0.3 mm.

7. An optical module comprising an optical device having as inputs both an optical signal and an electrical signal, for providing as an output a modified optical signal, said optical device exhibiting a predetermined impedance; and a broadband impedance matching circuit coupled at a first end as the electrical signal input to said optical device, said broadband circuit for providing broadband impedance matching between an external electrical signal source, coupled at a second, opposite end to said broadband impedance matching circuit, said broadband impedance matching circuit comprising a microstrip transmission line coupled at a first end to the optical device and coupled at a second, opposite end to the external electrical signal source, said transmission line defined as comprising a predetermined length L and width W for supporting propagation of an electrical input signal form said broadband signal source; and at least three pair of open stubs, each pair joined to the microstrip transmission line and exhibiting unique dimensions with respect to the remaining pairs of stubs such that each pair has a different length and width, with each stub in a pair of stubs having a substantially identical length $l_i$ and width $w_i$ and disposed on opposite sides of said transmission line in a symmetrical arrangement, the subscript i denoting a particular pair of stubs in the set of at least three pair of open stubs and used to define the unique length and width of that particular pair of open stubs.

8. An optical module as defined in claim 7 wherein each pair of stubs is disposed at a right angle relationship to the length L of the microstrip transmission line.

9. An optical module as defined in claim 7 where the at least three pair of open stubs comprises a plurality of three pair of open stubs, a first pair disposed in proximity to the first end of the microstrip transmission line, a third pair disposed in proximity to the second, opposing end of said microstrip transmission line and a second, remaining pair disposed in a region intermediate to the first and third pair.

10. An optical module as defined in claim 9 wherein the second pair of open stubs are disposed closer to the first pair of open stubs than the third pair of open stubs.

11. An optical module as defined in claim 7 wherein the microstrip transmission line comprises a length L of approximately 3.4 mm and a width W of approximately 0.483 mm.

12. An optical module as defined in claim 11 wherein the first pair of open stubs comprise a length $l_l$ of approximately 0.45 mm and a width $w_l$ of approximately 0.175 mm, the second pair of open stubs comprise a length $l_2$ of approximately 0.5 mm and a width $w_2$ of approximately 0.275 mm, and the third pair of open stubs comprise a length $l_3$ of approximately 0.3 mm and a width $w_3$ of approximately 0.3 mm.

13. An optical module as defined in claim 7 wherein the optical device comprises an electroabsorption optical modulator.

* * * * *